United States Patent
Fang et al.

[11] Patent Number: 6,070,601
[45] Date of Patent: Jun. 6, 2000

[54] JET-CLEANING DEVICE FOR DEVELOPING STATION

[75] Inventors: Wen-Liang Fang, Hsinchu; Ching-Chiy Cheng, Hsinchu Hsien; Richard Leu, Hsinchu Hsien; Kuo-Feng Huang, Chu-Pei, all of Taiwan

[73] Assignee: United Microelectronics Corp., Hsin-Chu, Taiwan

[21] Appl. No.: 09/064,408

[22] Filed: Apr. 22, 1998

[30] Foreign Application Priority Data

Mar. 18, 1998 [TW] Taiwan ................................. 87203956

[51] Int. Cl.[7] ............................................. B08B 3/02
[52] U.S. Cl. ............................................. 134/153; 134/902
[58] Field of Search ............................. 134/153, 157, 134/902, 198; 118/52, 318, 319, 320

[56] References Cited

U.S. PATENT DOCUMENTS

| | | | |
|---|---|---|---|
| 4,838,289 | 6/1989 | Kottman et al. | 134/153 |
| 4,982,694 | 1/1991 | Moriyama | 118/697 |
| 5,349,978 | 9/1994 | Sago et al. | 134/153 |
| 5,375,291 | 12/1994 | Tateyama et al. | 15/302 |
| 5,384,008 | 1/1995 | Sinha et al. | 156/643 |
| 5,529,626 | 6/1996 | Stewart | 118/500 |
| 5,608,943 | 3/1997 | Konishi et al. | 15/302 |
| 5,634,980 | 6/1997 | Tomita et al. | 134/3 |
| 5,677,000 | 10/1997 | Yoshioka et al. | 427/240 |
| 5,705,223 | 1/1998 | Bunkofske | 427/240 |
| 5,725,663 | 3/1998 | Parrette | 118/52 |
| 5,815,762 | 9/1998 | Sakai et al. | 396/611 |

Primary Examiner—Philip R. Coe

[57] ABSTRACT

A jet-cleaning device for a developing station, especially suitable for installing on a wafer back cleaning ring of a CLEAN TRACK MK-V developing station. The jet-cleaning device is used for cleaning the wafer back of a wafer mounted above a spinner. The jet-cleaning, device comprises a jet-cleaning block and a vertical nozzle. The jet-cleaning block has a nozzle groove having an inlet for pumping in a cleaning solution. The vertical nozzle is connected to the nozzle groove for forming a vertical jet of the cleaning solution so that waste liquid on a wafer back can be removed.

12 Claims, 2 Drawing Sheets

A CLEAN TRACK MK-V developing station.

JET-CLEANING DEVICE FOR DEVELOPING STATION

CROSS-REFERENCE TO RELATED APPLICATION

This application claims the priority benefit of Taiwan application Ser. No. 87203956, filed Mar. 18, 1998, the full disclosure of which is incorporated herein by reference.

BACKGROUND OF THE INVENTION

1. Field of Invention

The present invention relates to a jet-cleaning device for a CLEAN TRACK MK-V developing station. More particularly, the present invention relates to a jet-cleaning device having a vertical nozzle for establishing a vertical water jet so that waste liquid on a wafer back can be removed.

2. Description of Related Art

The manufacturing flow of integrated circuits (ICs) is rather complicated and involves hundreds of different processes requiring more than a month to finish. In general, the IC industry is a high-tech business that can be divided roughly into four main branches including IC design, wafer fabrication, wafer testing and wafer packaging.

Amongst the many steps required to fabricate semiconductor devices, photolithography can be regarded as one of the most frequently used processes. Any structures related to the fabrication of a MOS transistor, for example, patterning of various thin films or definition of doping areas, must be accomplished by a photolithographic process. Principally, a photolithographic process is carried out in three main steps including photoresist coating, light exposure and photoresist development.

In photoresist development, portions of the photoresist layer that have been illuminated by light are neutralized by chemicals and then removed so that a mask pattern hidden in the photoresist layer is revealed. In general, there are a number of ways for carrying out the development. However, in order to get photolithographic operations in-line with other processes, most manufacturers choose the "spray/puddle" method to develop photoresist. The spray/puddle method can be divided into three stages. In the first stage, developer is sprayed onto the surface of a wafer already placed on a spinner. Next, the developer is allowed to stay on the wafer surface for a period of time, in what is known as the puddle stage. Finally, after full development of the photoresist layer, the wafer is rinsed with water and then spun dry.

The aforementioned development processes can be accomplished on the same developing station. FIG. 1 is a cross-sectional side view showing a CLEAN TRACK MK-V developing station made by Japanese manufacturer.

The CLEAN TRACK MK-V developing station as shown in FIG. 1 is mainly used for developing 6 inch wafers. When the CLEAN TRACK MK-V developing station is carrying out a cleaning operation on wafer 14, the axle of spinner 10 provides a suitable vacuum so that the spin chuck 12 is able to grasp the wafer 14 by use of suction. As the spinner 10 spins, waste liquid on wafer surface 14 is carried to the edge and removed by centrifugal force. Through spinning, most of the waste liquid on the wafer surface is removed. However, some of the waste liquid will run onto the backside of the wafer 14. Hence, another cleaning operation to remove contaminants on the backside of the wafer 14 must subsequently be carried out.

FIG. 2A is a cross-sectional side view showing the jet-cleaning block of a conventional CLEAN TRACK MK-V developing station. FIG. 2B is a top view showing, the wafer back cleaning ring of a conventional CLEAN TRACK MK-V developing station.

On a conventional CLEAN TRACK MK-V developing station, contaminants on the backside of a wafer are removed through four jet-cleaning blocks 20 located above the wafer back cleaning ring, 18. The jet-cleaning blocks 20 are mounted onto the wafer back cleaning ring 18 through a set of fixed holes 28. Therefore, the jet-cleaning blocks 20 can be removed from the wafer back cleaning ring 18. Furthermore, there is a wall 16 acting as a barrier preventing the flow of waste liquid to the backside of the wafer. When the chemical solution or waste liquid try to flow onto the wafer back, the jet-cleaning block 20 on the wafer back cleaning ring 18 sends out a jet of water at an angle of about 45°. The water jet is labeled 26 in FIG. 1. Water for the water jet 26, which removes the chemical solution and waste liquid, comes in through an Inlet 22 and out through an outlet 24. Details are shown in FIG. 2A.

The distance $d_1$ from the edge of the wafer 14 to its center (for a 6-inch wafer) is 75 mm. The distance $d_2$ from the center of the wafer 14 to the edge of the spin chuck 12 is 33 mm. If a wafer jet produced by a conventional jet-cleaning block 20 is used to clean to the wafer, only the area up to a distance $d_3$ of about 25.5 mm from the edge of the wafer 14 can be reached. In fact, when chemical solution or waste liquid flows onto the wafer back, the back flow distance can be greater than $d_3$. Therefore, a conventional jet-cleaning block 30 can at most clean the area covered by $d_3$ while leaving contaminants behind in other areas.

In summary, the water jet formed by a conventional jet-cleaning block is roughly at a 45° angle. Hence, the water jet is only capable of cleaning an area of about 25.5 mm from the edge of the wafer. Outside this area, this method is incapable of removing the waste liquid carried by a back flow.

In light of the foregoing, there is a need to design a better jet-cleaning block.

SUMMARY OF THE INVENTION

Accordingly, the present invention is to provide a jet-cleaning device for a developing station that utilizes a vertical nozzle to establish a vertical water jet, which replaces the tilted water jet produced by a conventional jet-cleaning block.

In another aspect, this invention provides a jet-cleaning device that can clean a larger wafer back area without major modification of the CLEAN TRACK MK-V developing station. Only a conventional jet-cleaning block needs to be modified.

To achieve these and other advantages and in accordance with the purpose of the invention, as embodied and broadly described herein, the invention provides a jet-cleaning device above the wafer back cleaning ring of a CLEAN TRACK MK-V developing station so that the wafer back of a wafer mounted above a spinner can be cleaned. The jet-cleaning device comprises a jet-cleaning block and a vertical nozzle. The jet-cleaning block has a nozzle groove having an inlet for pumping in a cleaning solution. The vertical nozzle is connected to the nozzle groove directing a vertical jet onto the wafer back for removing waste liquid.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
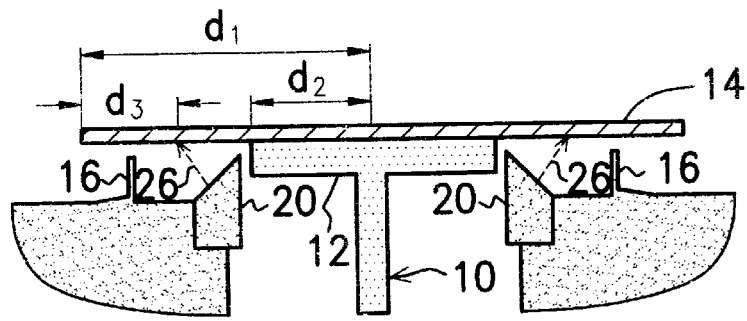
FIG. 1 is a cross-sectional side view showing a CLEAN TRACK MK-V developing station.

Reference will now be made in detail to the present preferred embodiments of the invention, examples of which are illustrated in the accompanying drawings. Wherever possible, the same reference numbers are used in the drawings and the description to refer to the same or like parts.

Figure 3:
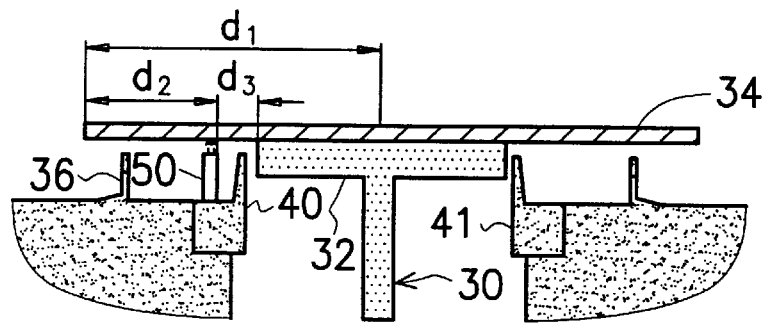
FIG. 3 is a cross-sectional side view showing a CLEAN TRACK MK-V developing station modified according to one preferred embodiment of this invention.

FIG. 3 is a cross-sectional side view showing a CLEAN TRACK MK-V developing station modified according to one preferred embodiment of this invention.

When the CLEAN TRACK MK-V developing station is carrying out a cleaning operation on wafer 34, the axle of spinner 30 provides a vacuum so that the spin chuck 32 is able to grasp the wafer 34 by means of suction. As the spinner 30 spins, waste liquid on wafer surface 34 will be carried to the edge and thrown away by centrifugal force. Through spinning, most of the waste liquid on the wafer surface will be removed. However, some of the waste liquid will run onto the backside of the wafer 34. Hence, another cleaning operation to remove contaminants on the backside of the wafer 34 must be subsequently carried out.

Figure 4A:
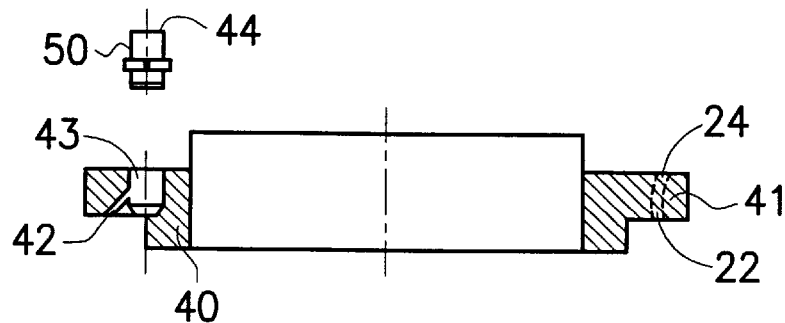
FIG. 4A is a cross-sectional side view showing the jet-cleaning block of a CLEAN TRACK MK-V developing station according to one preferred embodiment of this invention.
Figure 4B:
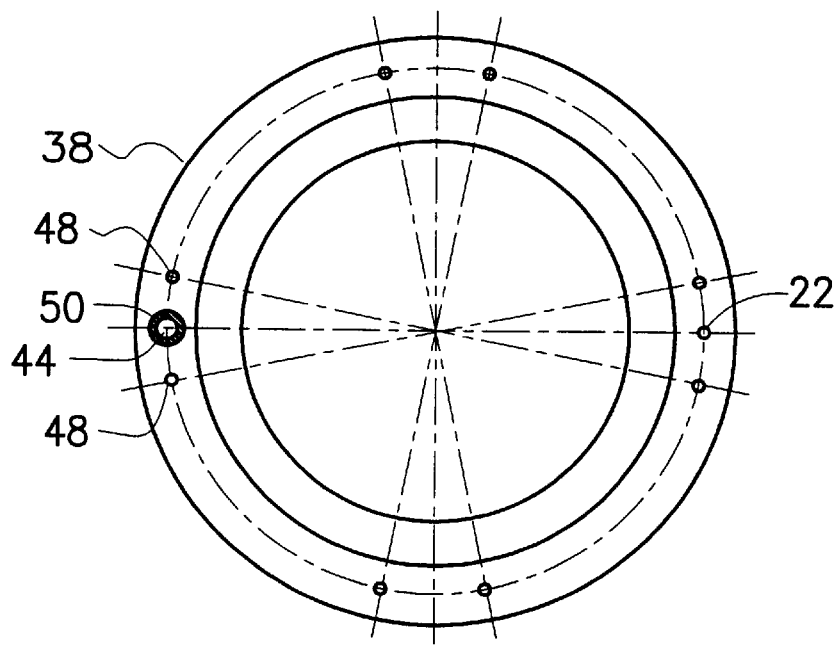
FIG. 4B is a top view showing the wafer back cleaning ring of a CLEAN TRACK MK-V developing station according to one preferred embodiment of this invention.

FIG. 4A is a cross-sectional side view showing the jet-cleaning block of a CLEAN TRACK MK-V developing station according to one preferred embodiment of this invention. FIG. 4B is a top view showing the wafer back cleaning ring of a CLEAN TRACK MK-V developing station according to one preferred embodiment of this invention.

As shown in FIGS. 3, 4A and 4B, the modified jet-cleaning device of a CLEAN TRACK MK-V developing station comprises a jet-cleaning block 40 and a vertical nozzle 50. Similar to a conventional jet-cleaning assembly, the jet-cleaning block 40 can be separated from the wafer back cleaning ring 38. The jet-cleaning block 40 and the wafer back cleaning ring 38 are assembled together through a set of fixed holes 48. Furthermore, a wall 36 acting as a barrier preventing the flow of waste liquid to the backside of the wafer is similarly erected.

Figure 2A:
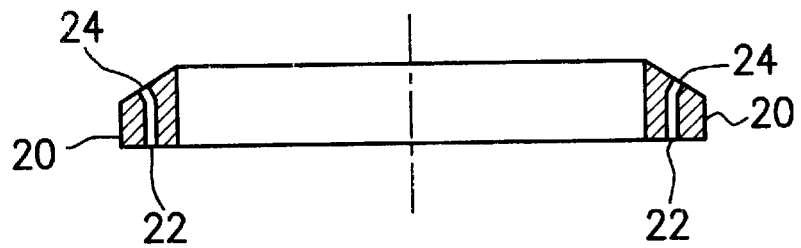
FIG. 2A is a cross-sectional side view showing the jet-cleaning block of a conventional CLEAN TRACK MK-V developing station.
Figure 2B:
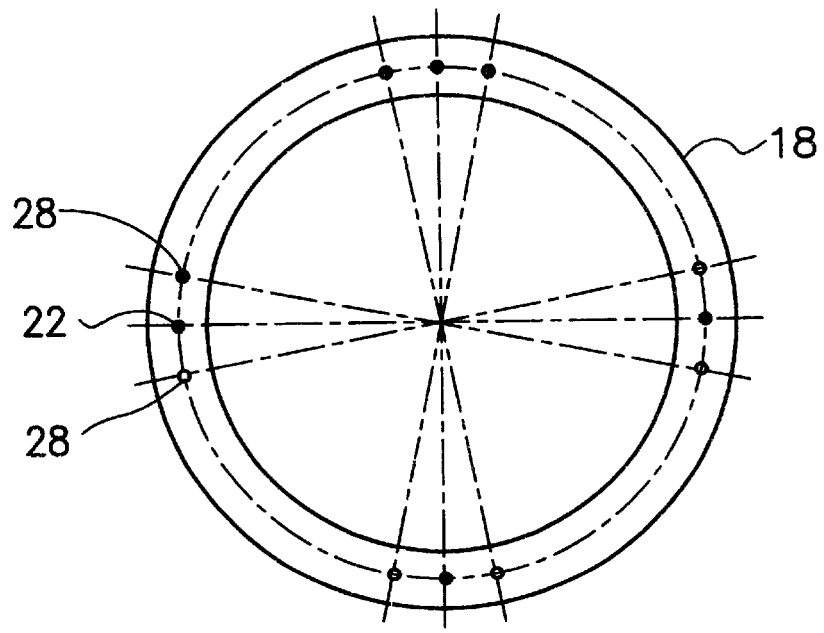
FIG. 2B is a top view showing the wafer back cleaning ring of a conventional CLEAN TRACK MK-V developing station.

The jet-cleaning block 40 of this invention has an inlet 42 and a nozzle groove 43. The inlet 42 is positioned at exactly the same location as the inlet 22 of a conventional wafer back cleaning ring as shown in FIG. 2B. The nozzle groove 43 is used to connect to a vertical nozzle 50. In operation, a cleaning solution or water coming in from inlet 42 is directed to the outlet 44 of the vertical nozzle 50 and then ejected vertically forming a jet as shown in FIG. 4A.

When chemical solution or waste liquid flows onto the wafer back, the jet-cleaning block 40 mounted on the wafer back cleaning ring 38 will send a jet of water or cleaning solution at an angle of about 90°. As shown in FIG. 3, chemical solution and waste liquid on the wafer back is removed by the water jet.

The distance $d_1$ from the edge of the wafer 34 to its center is 75 mm. If water jet produced by a jet-cleaning block 40 is used to clean the wafer, area up to a distance $d_2$ of about 37 mm from the edge of the wafer 34 can be reached. Furthermore, to prevent water or cleaning solution from being sucked up by the vacuum created for holding wafer 34, a safe distance $d_3$ of about 5 mm between the vertical nozzle 50 and the spin chuck 32 is allowed.

The jet-cleaning block 40 and assembly with wafer back cleaning ring 38 provided by this invention is very similar to that of a conventional design. In fact, other devices of a CLEAN TRACK MK-V developing station need no modification. Only the jet-cleaning block needs to be modified. In other words, by replacing the conventional jet-cleaning block 20 with the jet-cleaning block 40, the goal of increasing wafer-cleaning area is achieved.

In addition, only one jet-cleaning block 40 having a vertical nozzle 50 needs to be mounted onto the wafer back cleaning ring 38. The other three positions can have jet-cleaning blocks 41 without a vertical nozzle. In other words, a single vertical nozzle 50 sending out a vertical jet already has sufficient capacity for removing waste liquid that flows onto a wafer back.

In summary, this invention is able to provide a vertical nozzle (single hole) for creating a water jet instead of the tilted jets (four holes) produced by four lo conventional jet-cleaning blocks. Moreover, other devices on the CLEAN TRACK MK-V developing station need no modification. By modifying the conventional jet-cleaning block, the goal of increasing area cleaned on a wafer can be achieved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A jet-cleaning device for a developing station, especially suitable for installing on a wafer back cleaning ring of a CLEAN TRACK MK-V developing station, wherein the jet-cleaning device is used for cleaning a wafer back above a spinner, comprising:

a first jet-cleaning block, located near to the spinner, having a nozzle groove, wherein the nozzle groove includes an inlet for pumping in a cleaning solution;

a vertical nozzle connected to the nozzle groove for forming a vertical jet of the cleaning solution to clean the wafer back;

a second jet-cleaning block, located near to the spinner having a bent inlet so as to form an outwardly inclined jet of the cleaning solution to clean a circumferential region of the wafer back.

2. The device of claim 1, wherein the jet-cleaning blocks further include a first fixing hole and a second fixing hole for mounting the jet-cleaning block onto the wafer back cleaning ring.

3. The device of claim 1, wherein the cleaning solution includes water.

4. The device of claim 1, wherein a safe distance between the jet cleaning blocks and the spinner is at least about 5 mm.

5. A jet-cleaning device for cleaning a wafer back of a wafer, which is held by a spinner through a vacuum system to generate a sucking force, the device comprises:

at least one first jet-cleaning block having a vertical nozzle so as to form a vertical jet of a cleaning solution for cleaning the wafer back at a central region near to the spinner; and at least one second jet-cleaning block having a bent inlet so as to form an outwardly inclined jet of the cleaning solution for cleaning the wafer back at a circumferential region of the wafer.

6. The device of claim 5, wherein the first jet-cleaning block further comprises a nozzle groove having an inlet for pumping in the cleaning solution, wherein the vertical nozzle is connected to the nozzle groove.

7. The device of claim 5, wherein the device includes one said first jet-cleaning block and three said second jet-cleaning blocks, in which all the four jet-cleaning blocks are evenly distributed on a circle with a safe radius, which is sufficiently greater than a spinner radius so as to prevent the cleaning solution from being sucked-in to the vacuum system.

8. The device of claim 7, wherein the safe radius is greater than the spinner radius by about 5 mm.

9. The device of claim 5, wherein the first and the second jet-cleaning blocks are located at a safe distance from a rim of the spinner so as to prevent the cleaning solution from being sucked-in to the vacuum system.

10. The device of claim 9, wherein the safe distance is about 5 mm or slightly more than 5 mm.

11. The device of claim 9, wherein the inclined jet of the cleaning solution has an tilted angle of about 45° outwardly from a vertical direction of the wafer.

12. A jet-cleaning device for a developing station, especially suitable for installing on a wafer back cleaning ring of a CLEAN TRACK MK-V developing station for cleaning a wafer back above a spinner, comprising:

a first jet-cleaning block having a nozzle groove, wherein the nozzle groove includes an inlet for pumping in a cleaning solution;

a first nozzle for generating a vertical jet of the cleaning solution, wherein the first nozzle is connected to the nozzle groove and has a vertical fluid passage and a substantially flat end which is substantially perpendicular to a longitudinal axis of the vertical nozzle;

a second jet-cleaning block having a bent inlet so as to form an outwardly inclined jet of the cleaning solution to clean a circumferential region of the wafer back.

* * * * *